United States Patent
Ricking et al.

(10) Patent No.: US 7,232,536 B2
(45) Date of Patent: Jun. 19, 2007

(54) METHOD FOR PRODUCING LIGHT-GUIDING LED BODIES IN TWO SPATIALLY AND TEMPORALLY SEPARATE STEPS

(75) Inventors: Thorsten Ricking, Moers (DE); Cem Olkay, Witten (DE)

(73) Assignee: G.L.I. Global Light Industries GmbH, Kamp-Lintfort (DE)

(*) Notice: Subject to any disclaimer, the term of this patent is extended or adjusted under 35 U.S.C. 154(b) by 60 days.

(21) Appl. No.: 10/500,044

(22) PCT Filed: Dec. 23, 2002

(86) PCT No.: PCT/DE02/04738

§ 371 (c)(1),
(2), (4) Date: Feb. 9, 2005

(87) PCT Pub. No.: WO03/056637

PCT Pub. Date: Jul. 10, 2003

(65) Prior Publication Data

US 2005/0127543 A1    Jun. 16, 2005

(30) Foreign Application Priority Data

Dec. 24, 2001   (DE) .............................. 101 63 116

(51) Int. Cl.
*B29C 45/14*   (2006.01)
(52) U.S. Cl. .................... 264/250; 264/272.16
(58) Field of Classification Search ........... 264/272.16, 264/250, 255
See application file for complete search history.

(56) References Cited

FOREIGN PATENT DOCUMENTS

| | | |
|---|---|---|
| DE | 27 22 291 | 11/1977 |
| DE | 87 07 850 | 8/1987 |
| DE | 42 32 644 | 3/1994 |
| EP | 0 635 744 | 1/1995 |
| GB | 2 282 700 | 4/1995 |
| JP | 63 129680 | 6/1988 |
| JP | 63 318173 | 12/1988 |
| JP | 01 069020 | 3/1989 |
| JP | 64-69019 | * 3/1989 |
| JP | 64-69020 | * 3/1989 |
| JP | 05 090645 | 4/1993 |
| JP | 06 216412 | 8/1994 |
| JP | 10 065220 | 3/1998 |
| JP | 2000 223748 | 8/2000 |

OTHER PUBLICATIONS

PCT Search Report.

* cited by examiner

*Primary Examiner*—Edmund H. Lee

(57) ABSTRACT

The invention relates to a method for producing light-guiding LED bodies, in two casting and/or injection molding steps, from a material which is free-flowing before being finally solidified. First, the electronic components, consisting of at least one light-emitting chip and at least two electrical terminals connected to said chip, are coated by means of casting or injection molding, and are then recoated by means of casting or injection moulding, at least in one region, in a larger LED end mold. The present invention provides a method for the production of light-guiding LED bodies, whereby almost all light-emitting diodes produced have the same optical characteristics, and rejection caused by damage of the individual LED electronic elements is avoided.

8 Claims, 2 Drawing Sheets

METHOD FOR PRODUCING LIGHT-GUIDING LED BODIES IN TWO SPATIALLY AND TEMPORALLY SEPARATE STEPS

This application is a National Stage of International Application No. PCT/DE02/04738, filed Dec. 23, 2002, which claims priority to DE 101 63 116.2, filed Dec. 24, 2001.

BACKGROUND OF THE INVENTION

Such a method for producing LED bodies is known from EP 0,290,697 A1. In this method, the front electrode regions, the chip and the bond wire are dipped in a resin bath in a first step. In another step, the electrodes and the resin-coated, cured end are placed in a mold where the resin-coated end is coated with plastic by injection molding in order to produce the LED body. In this method, the shape and the wall thickness of the coating on the electronic components varies from batch to batch. Consequently, the finished LEDs have different emissive properties when different materials are used in the individual coating steps on account of the different relative indices of refraction. In addition, regardless of the materials used, there exists the danger of damage to the electronic components through uncontrolled melting of the first coating.

SUMMARY OF INVENTION

Method of producing light-guiding LED bodies from a material which is flowable before finally being solidified, in two casting and/or injection molding steps, wherein the electronic components consisting of at least one light-emitting chip and at least two electrical terminal connected to the chip, are first coated by means of casting or injection molding, and then are again coated at least in regions by means of casting or injection molding in a larger final LED mold.

Consequently, the object of the present invention is to develop a method for producing light-guiding LED bodies in which nearly all light emitting diodes produced have the same optical properties, and rejects because of damage to the individual LED electronics are avoided.

This object is attained with the features of the main claim. To this end, in a first casting and/or injection molding step, to manufacture an intermediate stage LED, a first flowable material is placed in a blank mold in which the electronic components have been inserted at least in areas. The intermediate stage LED is arranged in the final LED mold with its rear on the mold bottom or in the vicinity of the mold bottom, forming an annular channel between the inner side wall region of the final LED mold and the outer wall of the intermediate stage LED. In a second casting and/or injection molding step, the first or a second flowable material is introduced through the annular channel.

Using the method according to the invention, light emitting diodes are produced by injection molding in two equivalent steps. In this method, the intermediate stage LED first produced already has great accuracy of shape so that all LEDs are produced under comparable initial conditions during injection molding in the second process step. Consequently, all LEDs have a nearly identical luminous intensity and uniform emissive characteristics.

Moreover, an appropriate conformation of the intermediate stage LED and the injection through an annular channel ensure that damage to the LED electronics is largely precluded.

BRIEF DESCRIPTION OF DRAWING

Further details of the invention are clear from the dependent claims and the description below of a schematically represented example embodiment.

DETAILED DESCRIPTION OF THE INVENTION

Figure 1:
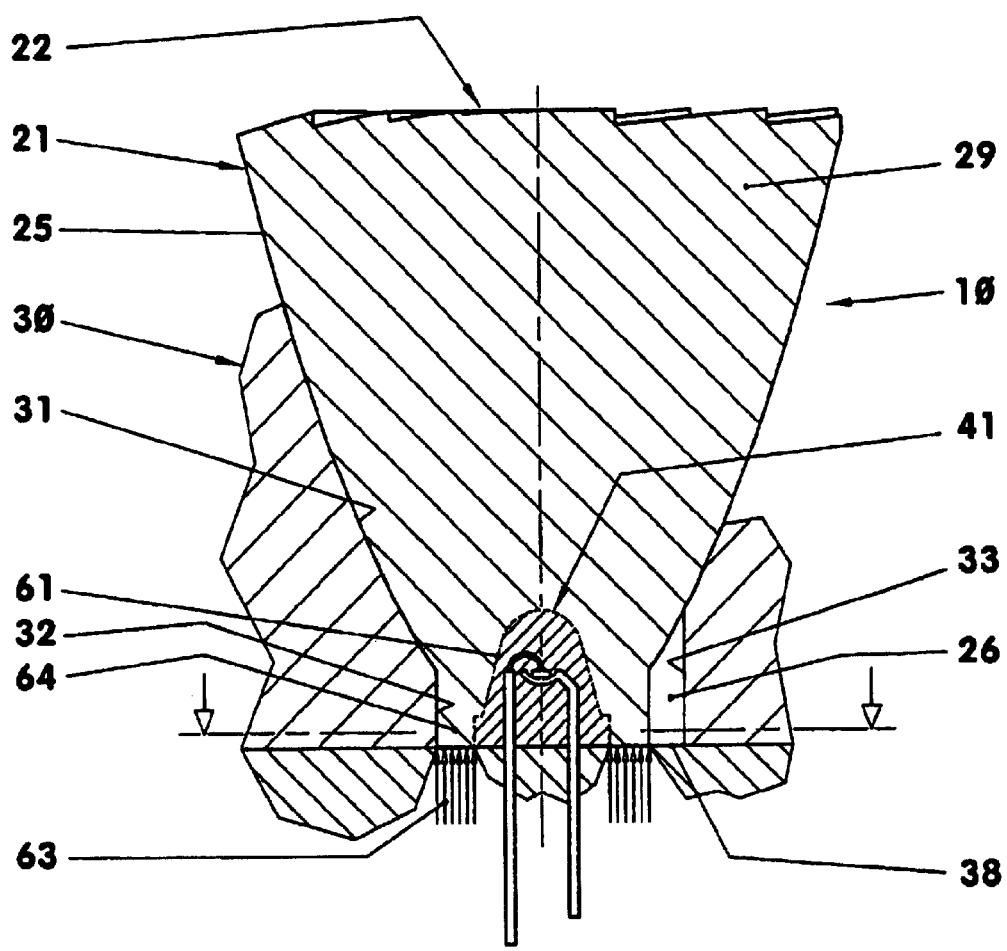
FIG. 1: LED body in longitudinal section.
Figure 5:
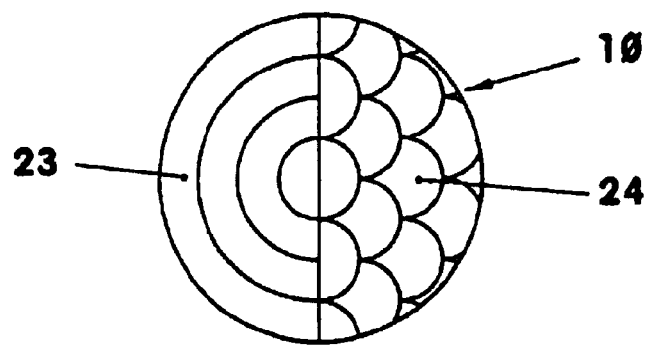
FIG. 5: Top view of FIG. 1.

FIGS. 1 and 5 show a large-volume LED (10) in a mold (30) whose light-guiding body is produced by injection molding in at least two injection steps.

The LED (10) shown in FIG. 1 consists here of two bodies (21, 41). The smaller body is an intermediate stage LED (41), while the body that surrounds it at least in regions and is larger here, for example, is referred to as the molded-on body (21).

Figure 3:
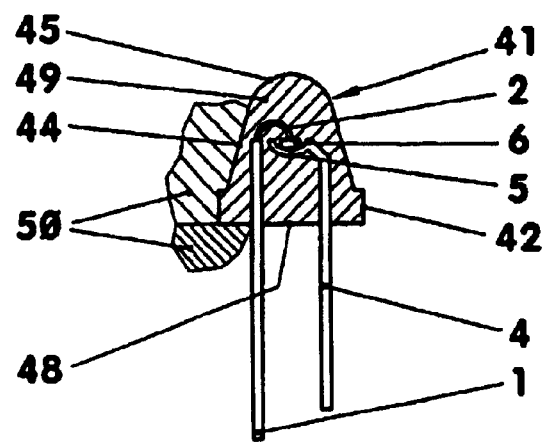
FIG. 3: Intermediate stage LED in longitudinal section.
Figure 4:
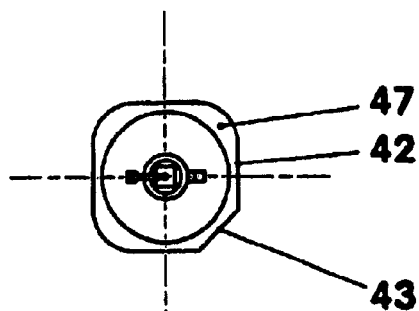
FIG. 4: Top view of the intermediate stage LED.

As shown in FIGS. 3 and 4, the intermediate stage LED (41), which is the inner lower region of the LED (10) from FIG. 1, surrounds, at least in regions, the electrical terminals (1, 4) and completely surrounds the light-emitting chip (6), a bond wire (2) and a reflector dish (5). The latter is part of the cathode (4), for example. The chip (6) sits in the reflector dish (5). The chip (6) contacts the anode (1) through the bond wire (2).

With regard to its spatial structure, the intermediate stage LED (41) of the example embodiment consists of three adjoining geometric shapes. The bottom geometric shape is at least approximately a rectangular prism. Its lateral surface (42), whose subsections are oriented normal to the center line of the intermediate stage LED (41), is rounded off at three corners. In place of the fourth corner, the lateral surface is embodied as a flattened chamfer (43). The rectangular prism is delimited at the top and bottom by parallel, flat end faces, for example. The bottom end face is the base (48). Adjoining the top end face (47) in a recessed manner is a truncated right cone whose lateral surface (44) in the shape of a truncated cone tapers away from the rectangular prism. The rectangular prism here has a width that is greater than the diameter of the bottom base surface of the molded-on truncated cone. A spherical cap (45) sits on the truncated cone. Located between the cap (45) and the lateral surface (44) in a longitudinal section through the intermediate stage LED (41) is a tangential transition, for example.

The material of the intermediate stage LED (41) is a transparent, e.g. colored, injection-moldable thermoplastic (49), for example a modified polymethyl methacrylimide (PMMI).

The intermediate stage LED (41) is produced in a separate injection mold, in a so-called blank mold (50). As a general rule, the electronic components (1-6) of multiple intermediate stage LEDs (41) are injection-molded in the same mold at the same time.

The molded-on body (21) is arranged around the intermediate stage LED (41). A parting line (61) that is no longer detectable on the finished LED (10) is present between the two items (21, 41). The molded-on body (21) or the finished LED (10) has the shape of a paraboloid, for example, at the focus of which is located the light emitting chip (6). As shown in FIG. 5, the end face (22) thereof opposite the chip (6), referred to as the primary emergent surface, has its respective halves embodied as a Fresnel lens (23) and a diffusing surface (24) with a scale structure. Depending on its optical function, the primary emergent surface (22) can have a simple geometric curvature, cf. convex or concave forms, or any desired free-form solid shape. It can also be constructed from a combination of individual regular geometric surface elements such as cones, pyramids, hemispheres, toroidal sections, or the like.

The lateral paraboloidal outer surface of the molded-on body (21) shown in FIG. 1 is what is called a secondary emergent surface (25). It can be made smooth or profiled and can take on almost any desired free-form shape. It can also be provided, either partially or completely, with a transparent or opaque coating. It can be galvanically metallized as an additional reflector surface if desired. With smooth, for example curved, solid shapes as are shown in FIG. 1, total internal reflection can occur even without separate metallization.

To produce the molded-on body (21), the intermediate stage LED (41) is placed in the split cavity injection mold, the so-called final LED mold (30). FIG. 1 only shows the split cavity final LED mold (30) in part. A part of the cylindrical and paraboloid-shaped side wall areas (31, 32), a part of the side wall area (33) for forming a lug (26) in the shape of part of a rectangular prism, and part of the mold bottom (38) are visible.

The rear (48) of the inserted intermediate stage LED (41) contacts the mold bottom (38). The rear (48) may also be separated from the mold bottom (38) by a few millimeters if desired. The geometric center lines of the inside contour of the final LED mold (30) and the center line of the intermediate stage LED (41) are identical here.

Figure 2:
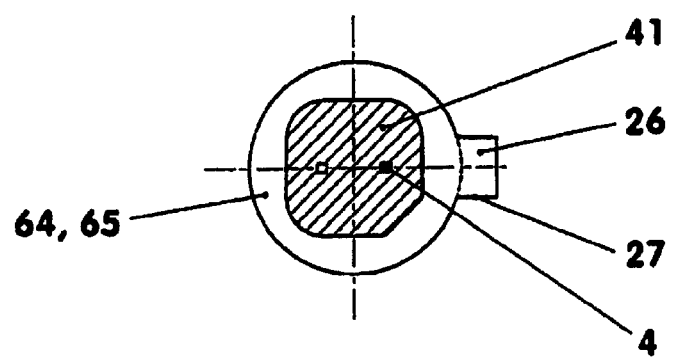
FIG. 2: Cross-section of FIG. 1 beneath the electronic components.

After the final LED mold (30) has been closed, prior to injection, an annular channel (64) is discernible between the bottom cylindrical side wall region (32) of the final LED mold (30) and the lateral surface (42) of the intermediate stage LED (41), see FIG. 1. This annular channel (64) has a cross-sectional area (65) that is shown in FIG. 2. During injection molding, the low-viscosity material (29) is injected from the injection zone (63) through this cross-sectional area (65), which continues into the final LED mold (30), see the arrows in FIG. 1, which indicate the injection zone (63) and the direction of injection. If necessary, the cross-sectional area of the lug (26) is also used for the injection process.

The incoming hot plastic (29) flows around the intermediate stage LED (41) during filling of the final LED mold (30). In this process, the liquid plastic (29) solubilizes the plastic (49) of the surface regions of the intermediate stage LED (41) so that both plastics (29, 49) cross-link or melt together there. The injection zone (63) and injection direction shown ensure that the inrushing plastic (29) flows only tangentially past the intermediate stage LED (41), without solubilizing it to the depth of the electronic components. This ensures protection of the electronic components (1-6). The fact that the lateral surface (44) is recessed back from the lateral surfaces (42, 43) reinforces this effect. The tapering of the lateral surface (44) in the flow direction additionally prevents unwanted erosion of the intermediate stage LED (41).

After solidification, the two masses (29, 49) form a homogeneous plastic LED body that exhibits no refraction of light in the region of the former parting line (61).

As an alternative to injection from the end face, the plastic (29) can also be introduced into the annular channel through the lug (26) to form the molded-on body (21). In this case, the plastic (29) is injected into the lug (26) normal to the plane in which the electrodes (1, 4) lie; in FIGS. 1 and 3, this is the plane of the drawing. The injection point is in the region at or below the center of gravity of the lug area (27) shown here. The inflowing plastic is sufficiently slowed down by the opposite outer wall of the lug (26) that the plastic stream flowing toward the intermediate stage LED (41) cannot produce a destructive force there.

To achieve high trueness of shape and precision of contour, an injection-compression molding process can be used. It is also conceivable to separately manufacture the primary emergent surface (22) with its lens and/or diffusing surface, for example, and place it in the injection mold ahead of time. The same applies to the secondary emergent surface (25).

In another alternative, a light-guiding body that is slightly smaller than the molded-on body (21) is placed in the mold above the intermediate-stage LED (41). In this case, this light-guiding body still has unfinished secondary emergent surfaces, for example, which is to say that its present side surfaces do not contact the final LED mold (30). During injection molding, the still empty intermediate spaces between the intermediate stage LED (41) and the inserted light-guiding body and between the light-guiding body and the final LED mold (30) are then filled. The injected plastic (29) melts the body located in the final LED form (30) with high precision of form and short cooling time. The latter is a function of factors including the prior insertion of the large-volume, cold light-guiding body, which here comes into contact with the newly injected liquid plastic only in a relatively thin edge region.

Here, too, an injection-compression molding step can also be added.

Of course, it is also possible with this method to produce a composite of multiple LEDs instead of individual light emitting diodes.

LIST OF REFERENCE NUMBERS

1 Terminal, anode, electrode
2 Bond wire, aluminum wire
4 Terminal, cathode, electrode
5 Reflector dish
6 Chip
10 LED
21 Molded-on body, also light-guiding body in parts
22 End face, primary emergent surface
23 Fresnel lens
24 Diffusing surface
25 Paraboloidal surface, secondary emergent surface, reflector surface; smooth
26 Lug in the shape of part of a rectangular prism
27 Side surface of (26)
29 Material of the molded-on body, second material
30 Final LED mold
31 Side wall area, paraboloid-shaped
32 Side wall area, cylindrical
33 Side wall area for lug (26)
38 Mold bottom
41 Intermediate stage LED, protective body for electronics
42 Lateral surface that is cylindrical and flat in areas, outer wall
43 Flattening, chamfer, outer wall
44 Truncated cone-shaped lateral surface, outer wall
45 Spherical cap, outer wall
47 End face, top, outer wall
48 Base, rear, outer wall
49 Material of intermediate stage LED, first material
50 Blank mold, for example split cavity
61 Parting line 63 Injection zone
64 Annular channel
65 Cross-sectional area

The invention claimed is:

1. Method for producing light-guiding LED bodies from a material which is flowable before finally being solidified, in two injection molding steps, comprising:

providing electronic components including at least one light-emitting chip having at least two electrical terminals connected to the chip, coating said electrical components by a first injection molding step, and thereafter again coating at least a part of said electrical components by a second injection molding step in a final LED mold wherein said first injection molding step provides an intermediate stage LED having a cone shaped surface and one or more lateral surfaces, said intermediate LED providing a first flowable material placed in a blank mold in which the electronic components have been inserted at least in part into the mold, and said intermediate stage LED is arranged in the final LED mold with a rear of the intermediate stage LED on a mold bottom of the final LED mold, and an annular channel is formed between an inner side wall region of the final LED mold and the one or more lateral surfaces of the intermediate stage LED, and in said second injection molding step, the first or a second flowable material is introduced through said annular channel, wherein said cone shape causes the second flowable material to flow into said final LED mold tangentially with respect to said intermediate LED.

2. Method from claim 1, wherein the first or the second flowable material is introduced into the final LED mold through the cross-section of the annular channel on the mold-bottom side.

3. Method from claim 1, wherein the second flowable material corresponds to the first.

4. Method from claim 1, wherein the side wall region adjoining the mold bottom of the final LED mold and laterally delimiting the annular channel is cylindrical in design, at least in the region of the annular channel.

5. Method from claim 1, wherein a center line of the blank mold is identical to the center line of the final LED mold.

6. The method of claim 1 wherein said one or more lateral surfaces of said intermediate stage LED is tapered and prevents unwanted erosion of said intermediate stage LED during said second injection molding step.

7. The method of claim 1 wherein a homogenous plastic body is formed after said second injection molding step, wherein said homogenous plastic LED body exhibits no refraction of light in the region of a former parting line between said intermediate stage LED and said final LED.

8. The method of claim 1 wherein said first injection molding step and said second injection molding step are injection-compression molding steps yielding a final LED having high trueness of shape and precision of contour.

* * * * *